United States Patent
Gao et al.

(10) Patent No.: US 10,389,109 B2
(45) Date of Patent: Aug. 20, 2019

(54) OVERVOLTAGE PROTECTION CIRCUIT AND OVERVOLTAGE PROTECTION CONTROL METHOD

(71) Applicant: FUJITSU LIMITED, Kawasaki-shi, Kanagawa (JP)

(72) Inventors: Hong Gao, Inagi (JP); Hiroyuki Nakamoto, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 231 days.

(21) Appl. No.: 15/431,256

(22) Filed: Feb. 13, 2017

(65) Prior Publication Data
US 2017/0256936 A1    Sep. 7, 2017

(30) Foreign Application Priority Data
Mar. 7, 2016 (JP) ................. 2016-043313

(51) Int. Cl.
| H02H 7/20 | (2006.01) |
| H02J 7/00 | (2006.01) |
| H02J 9/06 | (2006.01) |
| H01L 31/02 | (2006.01) |
| H02S 50/00 | (2014.01) |
| H02S 50/10 | (2014.01) |

(52) U.S. Cl.
CPC ......... *H02H 7/20* (2013.01); *H01L 31/02021* (2013.01); *H02J 7/007* (2013.01); *H02J 7/0029* (2013.01); *H02J 9/061* (2013.01); *H02S 50/00* (2013.01); *H02S 50/10* (2014.12); *Y02E 10/50* (2013.01)

(58) Field of Classification Search
None
See application file for complete search history.

(56) References Cited

U.S. PATENT DOCUMENTS

| 2003/0132732 A1* | 7/2003 | Thomas ................. H02H 9/042 320/134 |
| 2006/0197382 A1* | 9/2006 | Chou ...................... H02J 9/061 307/48 |
| 2012/0043453 A1 | 2/2012 | Kawamata |

FOREIGN PATENT DOCUMENTS

| JP | 62-158844 U | 10/1987 |
| JP | 2012-044070 A | 3/2012 |
| JP | 2014-011386 A | 1/2014 |

* cited by examiner

*Primary Examiner* — Jared Fureman
*Assistant Examiner* — Aqeel H Bukhari
(74) *Attorney, Agent, or Firm* — Arent Fox LLP

(57) ABSTRACT

There is provided an overvoltage protection circuit including: a comparator configured to compare a DC voltage supplied to a first load by a power generator with a first value set based on an upper limit of an operating voltage of the first load; a storage element configured to be charged with a portion of a current generated by the power generator; and a switch configured to change a flow of the current so that: when the DC voltage is higher than the first value, the portion of the current is supplied to the storage element and a second load coupled to the storage element in parallel, and when the DC voltage is less than or equal to the first value, the storage element supplies the second load with power.

7 Claims, 13 Drawing Sheets

OVERVOLTAGE PROTECTION CIRCUIT AND OVERVOLTAGE PROTECTION CONTROL METHOD

CROSS-REFERENCE TO RELATED APPLICATION

This application is based upon and claims the benefit of priority of the prior Japanese Patent Application No. 2016-043313, filed on Mar. 7, 2016, the entire contents of which are incorporated herein by reference.

FIELD

The embodiments discussed herein are related to an overvoltage protection circuit and an overvoltage protection control method.

BACKGROUND

In recent years, a technology called an environmental power generation (also referred to as an energy harvesting) that harvests an unused energy such as, for example, light energy or thermal energy that exists in an environment around us and converts the harvested energy into electric power is attracting attention.

In order to secure an operating voltage of a load, a plurality of power generation elements, such as solar cells or thermoelectric power generation elements outputting a DC voltage, are connected in series. However, when a power generation amount of each of the plurality of power generation elements is increased, a DC voltage to be supplied to a load may exceed the withstand voltage of a load (an upper limit of operating voltage of a load). For example, in a case of the solar cell, when the illuminance of incident light becomes higher, the DC voltage to be supplied to the load may exceed the withstand voltage of the load.

Conventionally, a circuit in which excess power is consumed by a transistor or a technology of separating some of a plurality of solar cell panels from a load is suggested when the power generated by the solar cells exceeds power demanded by a load.

Related technologies are disclosed in, for example, Japanese Laid-Open Utility Model Publication No. 62-158844, Japanese Laid-Open Patent Publication No. 2012-044070, and Japanese Laid-Open Patent Publication No. 2014-011386.

SUMMARY

According to an aspect of the invention, an overvoltage protection circuit includes: a comparator configured to compare a DC voltage supplied to a first load by a power generator with a first value set based on an upper limit of an operating voltage of the first load; a storage element configured to be charged with a portion of a current generated by the power generator; and a switch configured to change a flow of the current so that: when the DC voltage is higher than the first value, the portion of the current is supplied to the storage element and a second load coupled to the storage element in parallel, and when the DC voltage is less than or equal to the first value, the storage element supplies the second load with power.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

In the related art, in order not to allow the withstand voltage of a load to be exceeded, excess power consumed by, for example, a transistor or power generated by a solar cell panel separated from a load becomes useless. That is, when an overvoltage protection is performed, a portion of generated power becomes wasted.

In the following, an embodiment for implementing a technology that suppresses a state in which generated power becomes useless due to an overvoltage protection will be described with reference to the accompanying drawings.

First Embodiment

Figure 1:
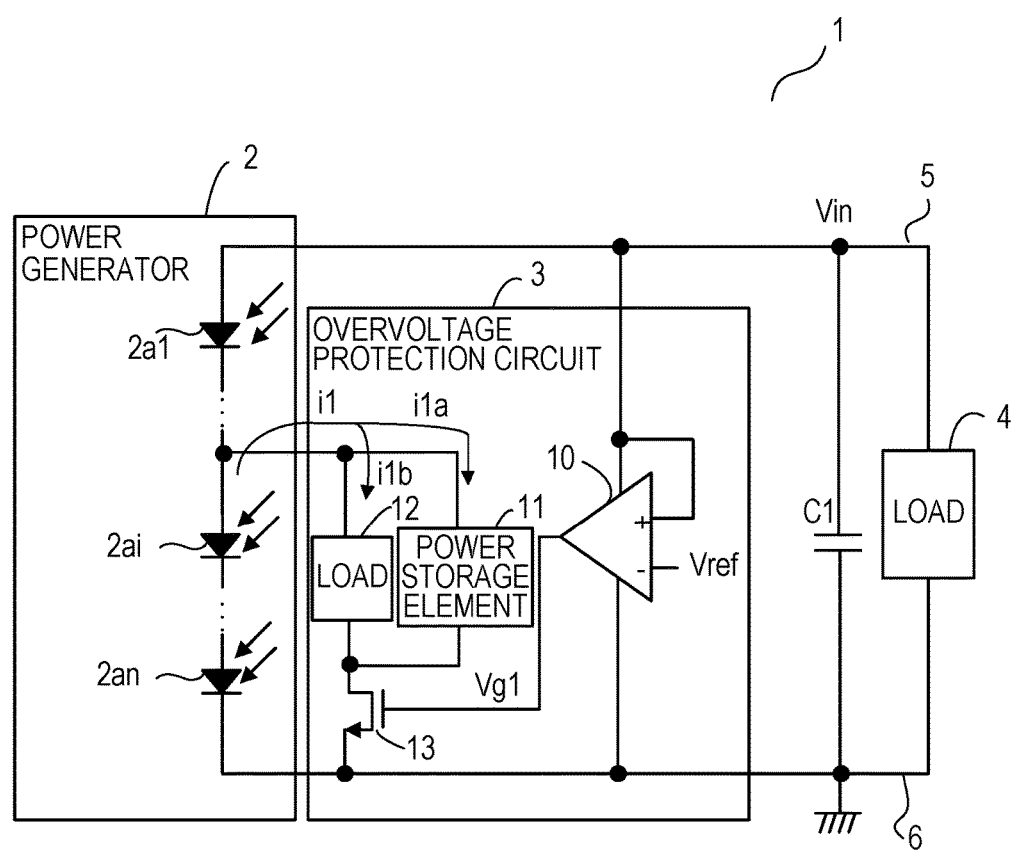
FIG. 1 is a diagram illustrating an example of an overvoltage protection circuit according to a first embodiment.

FIG. 1 is a diagram illustrating an example of an overvoltage protection circuit according to a first embodiment. In FIG. 1, an electronic device 1 including an overvoltage protection circuit 3 of the first embodiment, a power generator 2, a load 4, and a capacitor C1, is illustrated. The power generator 2 performs an environmental power generation and outputs a DC voltage Vin. The power generator 2 includes power generation elements $2a1, \ldots, 2ai, \ldots, 2an$ connected in series between a high potential power line 5 to which the DC voltage Vin is applied and a low potential power line 6 which becomes a ground potential.

In the following description, each of the power generation elements 2a1 to 2an is described as a solar cell, but may also be a different type of power generation element, such as a thermoelectric power generation element, which outputs a DC voltage. The power generator 2 may include a DC-DC converter boosting the voltage generated by the power generation elements 2a1 to 2an.

The overvoltage protection circuit 3 may prevent a voltage exceeding the withstand voltage of the load 4, that is, the upper limit of operating voltage of the load 4, from being applied to the load 4. The load 4 is connected between the high potential power line 5 and the low potential power line 6, and is operated by using the DC voltage Vin supplied from the power generator 2 as power source voltage. As for the load 4, various electronic circuits or electronic devices, such as, for example, a wireless module, may be applied.

The capacitor C1 is connected between the high potential power line 5 and the low potential power line 6, and stores electrical charges caused by the current generated by the power generator 2.

As illustrated in FIG. 1, the overvoltage protection circuit 3 of the first embodiment includes a comparator 10, a power storage element 11, a load 12, and a switch 13.

The comparator 10 compares the DC voltage Vin supplied from the power generator 2 to the load 4 with a reference voltage Vref which is a value set based on the upper limit of the operating voltage of the load 4, and outputs a result of the comparison. The reference voltage Vref may be the upper limit of the operating voltage of the load 4 and may be a value which is lower than the upper limit by a specified voltage.

The comparator 10 is connected between the high potential power line 5 and the low potential power line 6, and is operated by the DC voltage Vin supplied from the power generator 2. The reference voltage Vref is obtained by dividing the DC voltage Vin by, for example, a resistance voltage-dividing circuit which is not illustrated. In this case, the power to be supplied to the comparator 10 or the reference voltage Vref may also be generated using a primary battery.

In an example of FIG. 1, a circuit portion composed of the power storage element 11, the load 12, and the switch 13 is connected in parallel with respect to a series circuit composed of some of the power generation elements 2ai to 2an among the power generation elements 2a1 to 2an. In the example of FIG. 1, some of the power generation elements 2ai to 2an are plural power generation elements, but may also be a single power generation element.

The power storage element 11 accumulates electrical charges caused by a portion of currents generated by the power generator 2. The power storage element 11 is, for example, a capacitor or a secondary battery.

The load 12 is connected to the power storage element 11 in parallel. Various electronic circuits or electronic devices may be applied as the load 12. In the example of FIG. 1, the voltage to be supplied to the load 12 is lower than the voltage to be supplied to the load 4. For that reason, for example, when the load 4 is a wireless module, various sensors, such as a temperature sensor or a humidity sensor which are operated at a voltage lower than the wireless module, may be applied as the load 12. The load 12 may also be provided outside the overvoltage protection circuit 3.

When a comparison result, indicating that the DC voltage Vin is higher than the reference voltage Vref, is received from the comparator 10, the switch 13 controls the current such that a portion of currents generated by the power generator 2 is supplied to the power storage element 11 and the load 12. For example, when a comparison result indicating that the DC voltage Vin is higher than the reference voltage Vref is received, the switch 13 is turned ON. With this, the current flows from one end of the power generation element 2ai to the power storage element 11 and the load 12.

For example, the switch 13 is an n-channel metal-oxide semiconductor field effect transistor (MOSFET) of which the drain is connected to the power storage element 11 and the load 12, and the source is connected to the low potential power line 6. The gate of the switch 13 is connected to an output terminal of the comparator 10. In a case where the switch 13 is an n-channel MOSFET, when a logic level of an output signal of the comparator 10 is a high (H) level, the switch 13 is turned ON and otherwise, when the logic level is a low (L) level, the switch 13 is turned OFF.

In the following, an example of an overvoltage protection control method by the overvoltage protection circuit 3 of the first embodiment will be described.

Figure 2:
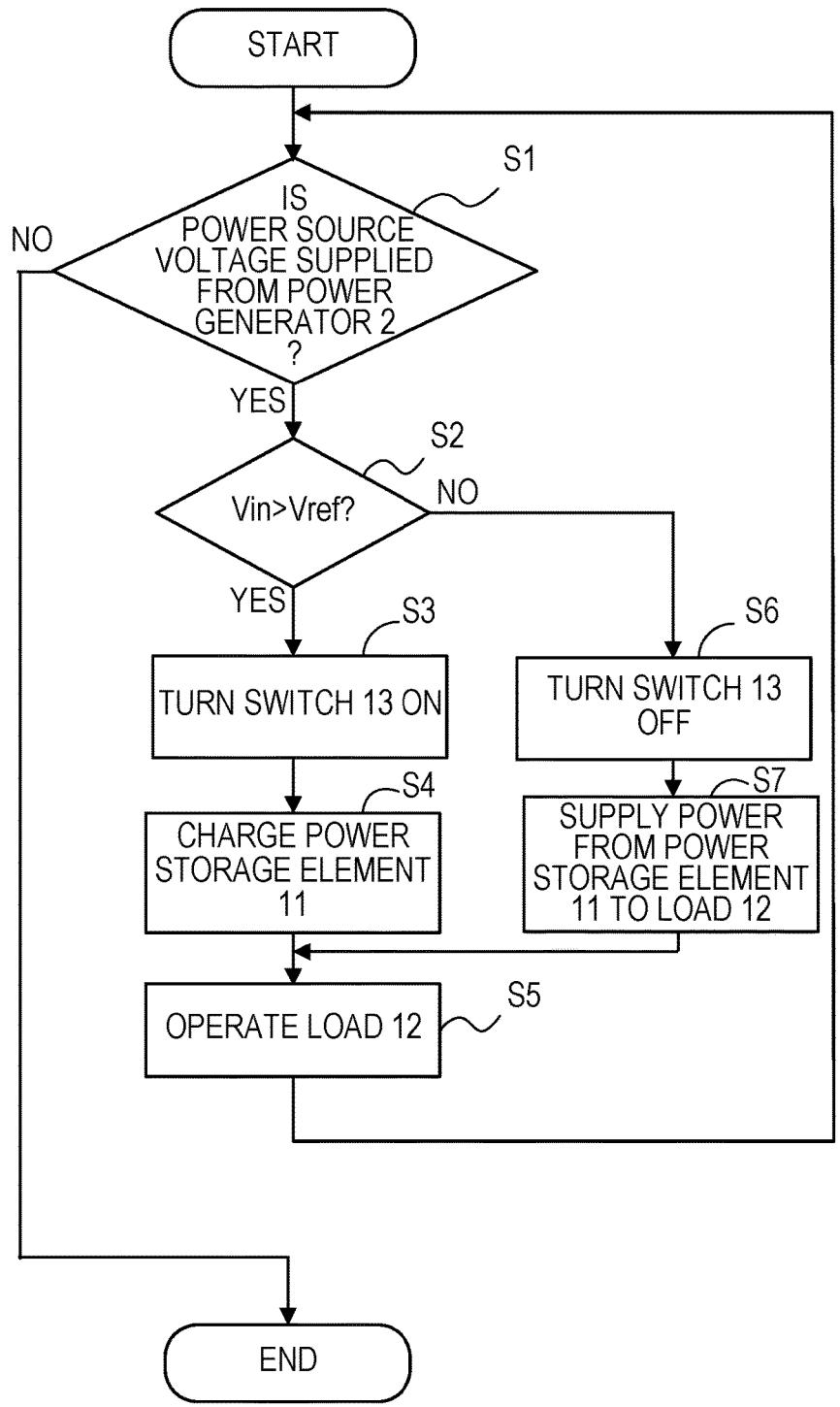
FIG. 2 is a flowchart illustrating an example of an overvoltage protection control method.

FIG. 2 is a flowchart illustrating an example of an overvoltage protection control method. When a power source voltage (DC voltage Vin) is supplied from the power generator 2 ("YES" at Operation S1), the comparator 10 outputs a comparison result which indicates whether the DC voltage Vin output from the power generator 2 is higher than the reference voltage Vref or not. That is, the comparator 10 determines whether the DC voltage Vin is higher than the reference voltage Vref (Operation S2).

When it is determined that a comparison result indicating that the DC voltage Vin is higher than the reference voltage Vref is received ("YES" at Operation S2), the switch 13 is turned ON (Operation S3). Accordingly, a flow of the current is changed such that a portion of the currents to be supplied from the power generator 2 to the load 4 is supplied to the power storage element 11 and the load 12. In the example of FIG. 1, the current i1a is supplied to the power storage element 11 and the current i1b is supplied to the load 12, among the currents i1 which are a part of the currents supplied to the load 4 from the power generator 2.

When the power storage element 11 is charged with the current i1a (Operation S4) and the voltage to be applied to the load 12 reaches an operating voltage, the load 12 performs a predetermined operation (e.g., a sensor operation) and consumes the current i1b (Operation S5). Thereafter, when supply of the power source voltage from the power generator 2 continues ("YES" at Operation S1), the processing from Operation S2 is repeated.

In the meantime, when a comparison result indicating that the DC voltage Vin is less than or equal to the reference voltage Vref is received ("NO" at Operation S2), the switch 13 is turned OFF (Operation S6). Accordingly, a flow of the current is changed such that the current generated by the power generation elements 2a1 to 2an of the power generator 2 is supplied to the load 4.

When the switch 13 is in a state of being turned OFF, discharge of the power storage element 11 is generated and power is supplied from the power storage element 11 to the load 12 (Operation S7). Accordingly, the processing of Operation S5 described above, that is, the operation of the load 12 due to discharge of the power storage element 11 is performed.

When the power source voltage is not supplied from the power generator 2, the comparator 10 is not operated and thus, the operation of the overvoltage protection circuit 3 is ended.

Figure 3:
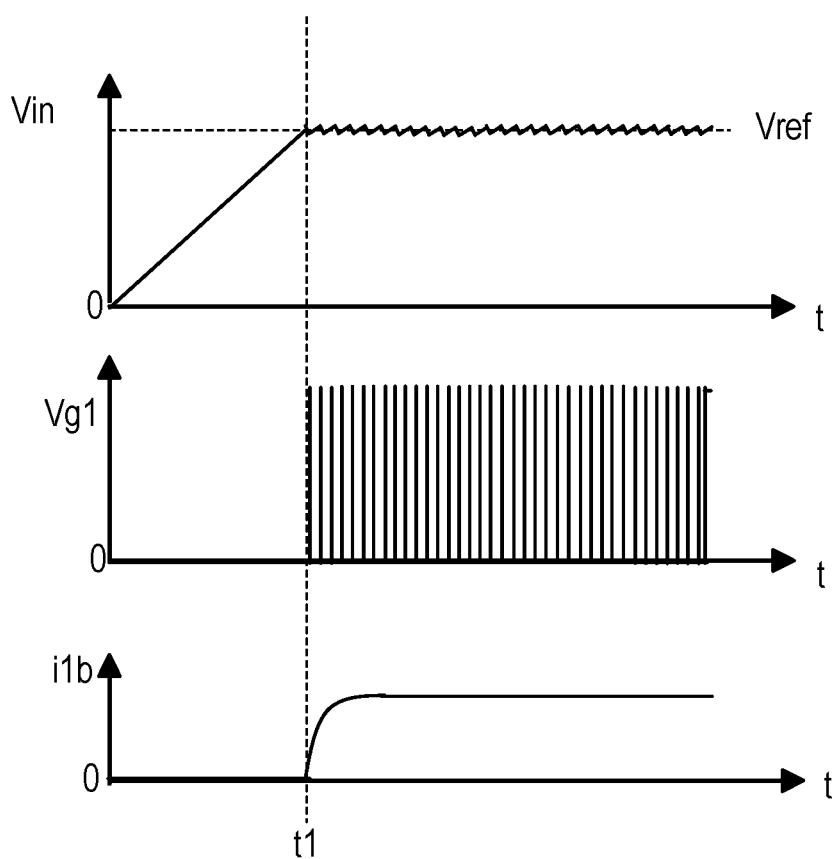
FIG. 3 is a timing chart illustrating an example of operations of the overvoltage protection circuit according to the first embodiment.

FIG. 3 is a timing chart illustrating an example of operations of the overvoltage protection circuit of the first embodiment. In FIG. 3, examples of temporal change in the DC voltage Vin, gate voltage Vg1 of the switch 13, and current i1b to be supplied to the load 12 are illustrated. The gate voltage Vg1 described above corresponds to an output signal (comparison result) of the comparator 10.

For example, the power generation elements 2a1 to 2an are irradiated with light and accordingly, the DC voltage Vin is increased and when the illuminance of light is high, as illustrated in FIG. 3, the DC voltage Vin exceeds the reference voltage Vref (timing t1). With this, the logic level of the gate voltage Vg1 becomes the H level and the switch 13 is turned ON. For that reason, the current i1b begins to flow to the load 12. Although not illustrated in FIG. 3, the power storage element 11 is charged with the current i1a as illustrated in FIG. 1.

As such, when the current flows in the power storage element 11 or the load 12, the current to be supplied to the capacitor C1 connected with the load 4 in parallel is decreased. For that reason, the voltage to be applied to the load 4 may be suppressed. That is, the load 4 may be protected from an overvoltage.

As in FIG. 3, each time when the DC voltage Vin becomes less than or equal to the reference voltage Vref or exceeds the reference voltage Vref, the logic level of the gate voltage Vg1 goes to the L level from the H level or goes to the H level from the L level. With this, the process of turning ON and OFF of the switch 13 is repeated. However, the current i1b flows due to electrical charges accumulated in the power storage element 11 even when the switch 13 is turned OFF and thus, the load 12 may continue to operate.

In the following, descriptions will be made on a difference between the overvoltage protection circuit 3 of the first embodiment and overvoltage protection circuits of two comparative examples performing an overvoltage protection, which are used by way of an example.

Comparative Example 1

Figure 4:
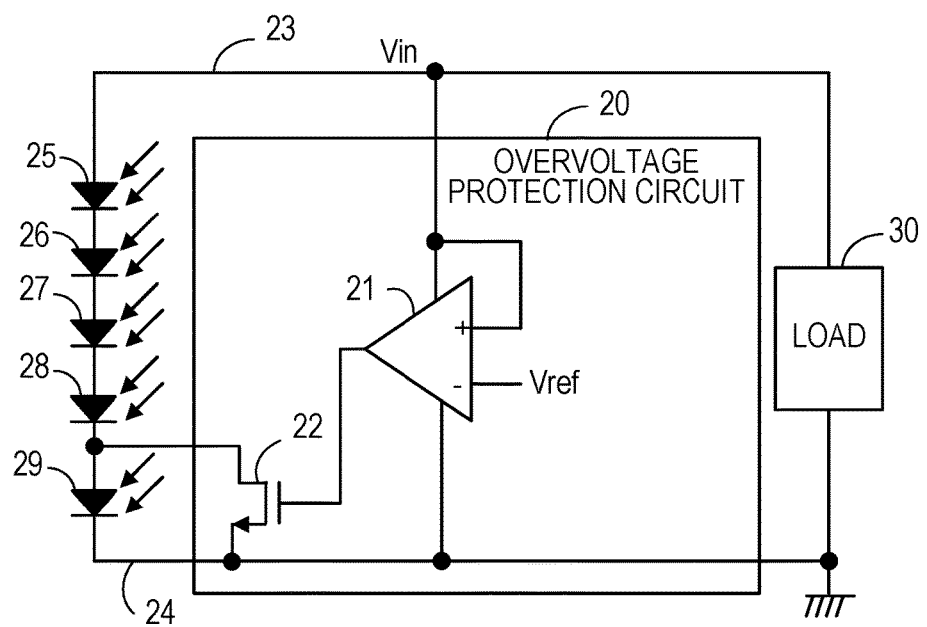
FIG. 4 is a diagram illustrating an example of an overvoltage protection circuit according to a first comparative example.

FIG. 4 is a diagram illustrating an example of an overvoltage protection circuit according to a first comparative example. The overvoltage protection circuit 20 includes a comparator 21 and a switch 22.

The comparator 21 is connected between a high potential power line 23 and a low potential power line 24 which is the ground potential, and is operated by the DC voltage Vin applied to the high potential power line 23. The comparator 21 compares the DC voltage Vin, which is generated by the power generation elements 25, 26, 27, 28, and 29 connected in series between the high potential power line 23 and the low potential power line 24, to the reference voltage Vref, and outputs a result of the comparison.

In the example of FIG. 4, the switch 22 is an n-channel MOSFET of which the drain is connected to a node formed between the power generation elements 28 and 29, and the source is connected to the low potential power line 24. When a comparison result indicating that the DC voltage Vin is higher than the reference voltage Vref is received from the comparator 21, the switch 22 is turned ON. Accordingly, both ends of the power generation element 29 are short-circuited and the voltage to be applied to the load 30 is lowered.

However, when the switch 22 is in a state of being turned ON, the power generated by the power generation element 29 becomes useless.

Comparative Example 2

Figure 5:
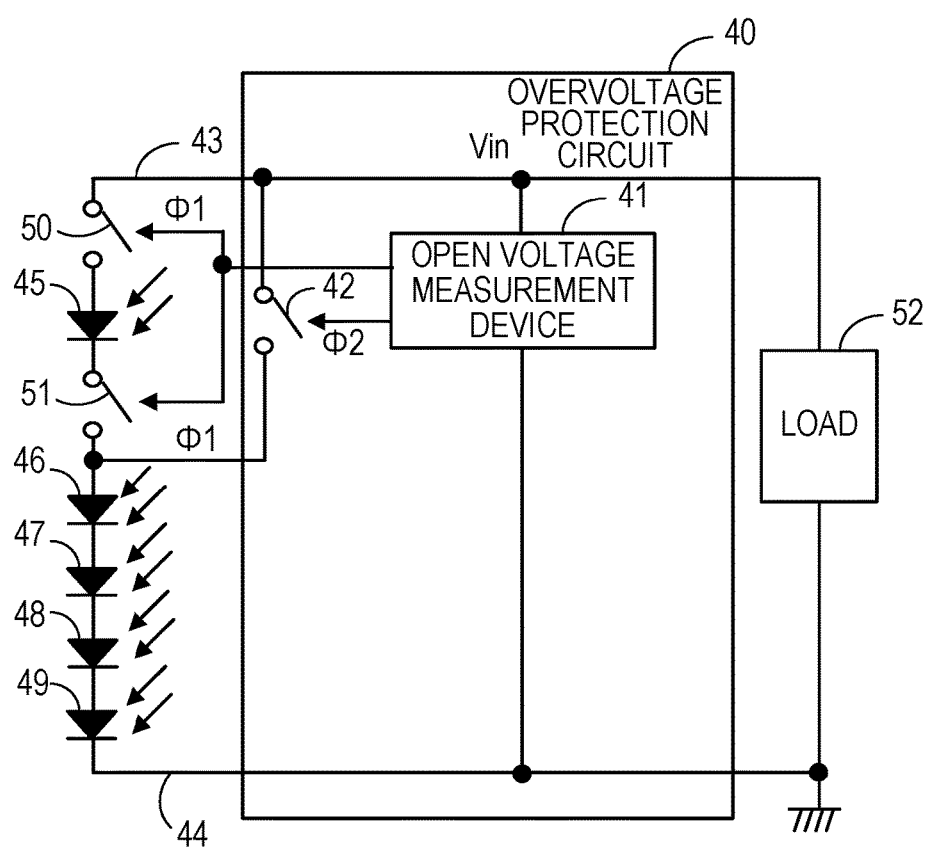
FIG. 5 is a diagram illustrating an overvoltage protection circuit according to a second comparative example.

FIG. 5 is a diagram illustrating an overvoltage protection circuit according to a second comparative example. The overvoltage protection circuit 40 includes an open voltage measurement device 41 and a switch 42. The open voltage measurement device 41 is connected between a high potential power line 43 and a low potential power line 44 which is the ground potential, and is operated by the DC voltage Vin applied to the high potential power line 43. The open voltage measurement device 41 compares the DC voltage Vin, which is generated by the power generation elements 45, 46, 47, 48, and 49 connected in series between the high potential power line 43 and the low potential power line 44, to the reference voltage Vref, and outputs control signals φ1 and φ2 based on a result of the comparison.

One end of the power generation element 45 is connected to the high potential power line 43 through a switch 50, and the other end of the power generation element 45 is connected to one end of the power generation element 46 through the switch 51. One end of the switch 42 is connected to the high potential power line 43 and the other end of the switch 42 is connected to a node between the switch 51 and the power generation element 46.

In the overvoltage protection circuit 40 described above, when the DC voltage Vin exceeds the reference voltage Vref, the open voltage measurement device 41 turns the switches 50 and 51 OFF by the control signal φ1 and turns the switch 42 ON by the control signal φ2. From this, both ends of the power generation element 45 are short-circuited, the power generation element 45 is separated from the load 52, and the voltage applied to the load 52 is lowered.

However, when the switches 50 and 51 are in a state of being turned OFF, the power generated by the power generation element 45 becomes useless.

In the following, the amount of electric power which becomes useless when the overvoltage protection circuits 20 and 40 illustrated in FIG. 4 and FIG. 5 are utilized is calculated. In the following, although descriptions will be made on the overvoltage protection circuit 40 illustrated in FIG. 5 by way of an example, descriptions may be made on the overvoltage protection circuit 20 similarly.

In the following, it is assumed that in each of the power generation elements 45 to 49, the output voltage ranges from Vimin to Vimax and the operating voltage of the load 52 ranges from Vlmin to Vlmax. It is assumed that the number of power generation elements 45 to 49 is Nmax (five elements in an example of FIG. 5) and the number of power generation elements supplying power to the load 52 is Nmin (four power generation elements in the example of FIG. 5) when the switches 50 and 51 are turned OFF.

When the power generation elements 45 to 49 are solar cells, a condition, under which the load 52 is capable of being operated even when the illuminance of incident light is low, is Vimin×Nmax≥Vlmin, that is, Nmax≥Vlmin/Vimin. When the illuminance of incident light is high, a condition under which the voltage to be applied to the load 52 is prevented from exceeding the withstand voltage of the load 52 is Vimax×Nmin≤Vlmax, that is, Nmin≤Vlmax/Vimax.

The ratio of a power loss due to the overvoltage protection circuit 40 to a total power generation amount by the power generation elements 45 to 49 becomes (total power generation amount−power generation amount to be supplied to load 52)/total power generation amount=1−power generation amount to be supplied to load 52/total power generation amount.

It becomes that (1−power generation amount to be supplied to load 52)/total power generation amount is 1−(Nmin×output power of each of power generation elements 45 to 49)/(Nmax×output power of each of power generation elements 45 to 49)=1−Nmin/Nmax.

Based on the two conditions described above, it becomes that 1−Nmin/Nmax≥1−(Vlmax/Vlmin)×(Vimin/Vimax).

In other words, the power loss caused (=occurs) when the overvoltage protection circuit 40 illustrated in FIG. 5 is utilized is determined by a range of the operating voltage of the load 52 and the range of the output voltage of each of the power generation elements 45 to 49.

For example, when the range of operating voltage of the load 52 is ranging from 2 V to 3.6 V and the range of the output voltage of each of the power generation elements 45 to 49 is ranging from 0.4 V to 0.9 V, it becomes that 1−(3.6/2)×(0.4/0.9)=0.2. That is, a loss of 20% is caused with respect to the total power generation amount of the power generation elements 45 to 49.

In contrast, in the overvoltage protection circuit 3 of the first embodiment illustrated in FIG. 1, when the DC voltage Vin is higher than the reference voltage Vref, a portion of the currents supplied to the load 4 is supplied to the power storage element 11 and the load 12 and thus, the generated power may be suppressed from becoming useless.

In the meantime, in the overvoltage protection circuit 3 illustrated in FIG. 1, the circuit portion composed of the power storage element 11, the load 12, and the switch 13 is connected in parallel with respect to the series circuit composed of some of power generation elements 2ai to 2an among the power generation elements 2a1 to 2an, but is not limited thereto. The circuit portion composed of the power storage element 11, the load 12, and the switch 13 may also be connected to the series circuit composed of the power generation elements 2a1 to 2an in parallel.

Figure 6:
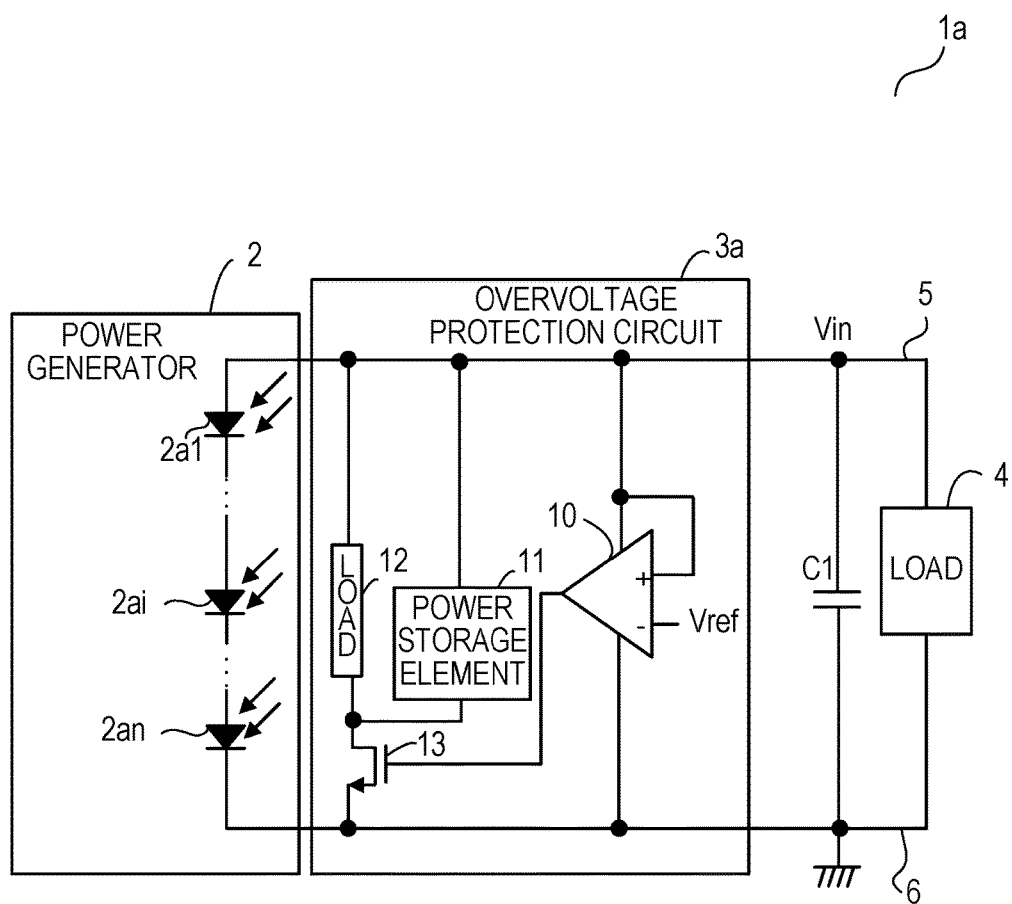
FIG. 6 is a diagram illustrating a modification example of the overvoltage protection circuit according to the first embodiment.

FIG. 6 is a diagram illustrating a modification example of the overvoltage protection circuit according to the first embodiment. The same elements as those illustrated in FIG. 1 are denoted by the same reference numerals. In an overvoltage protection circuit 3a of an electronic device 1a illustrated in FIG. 6, the circuit portion composed of the power storage element 11, the load 12, and the switch 13 is connected to the series circuit composed of the power generation elements 2a1 to 2an in parallel. Also, in the overvoltage protection circuit 3a described above, when the DC voltage Vin is higher than the reference voltage Vref, the switch 13 is turned ON and a portion of the currents supplied to the load 4 is supplied to the power storage element 11 and the load 12. For that reason, the load 4 may be protected from overvoltage and the generated power may be suppressed from becoming useless.

In the meantime, the following power supply control circuit may be utilized in order to supply stabilized power to the load 4. A comparator included in the power supply control circuit may be utilized instead of the comparator 10 of the overvoltage protection circuit 3 illustrated in, for example, FIG. 1.

Figure 7:
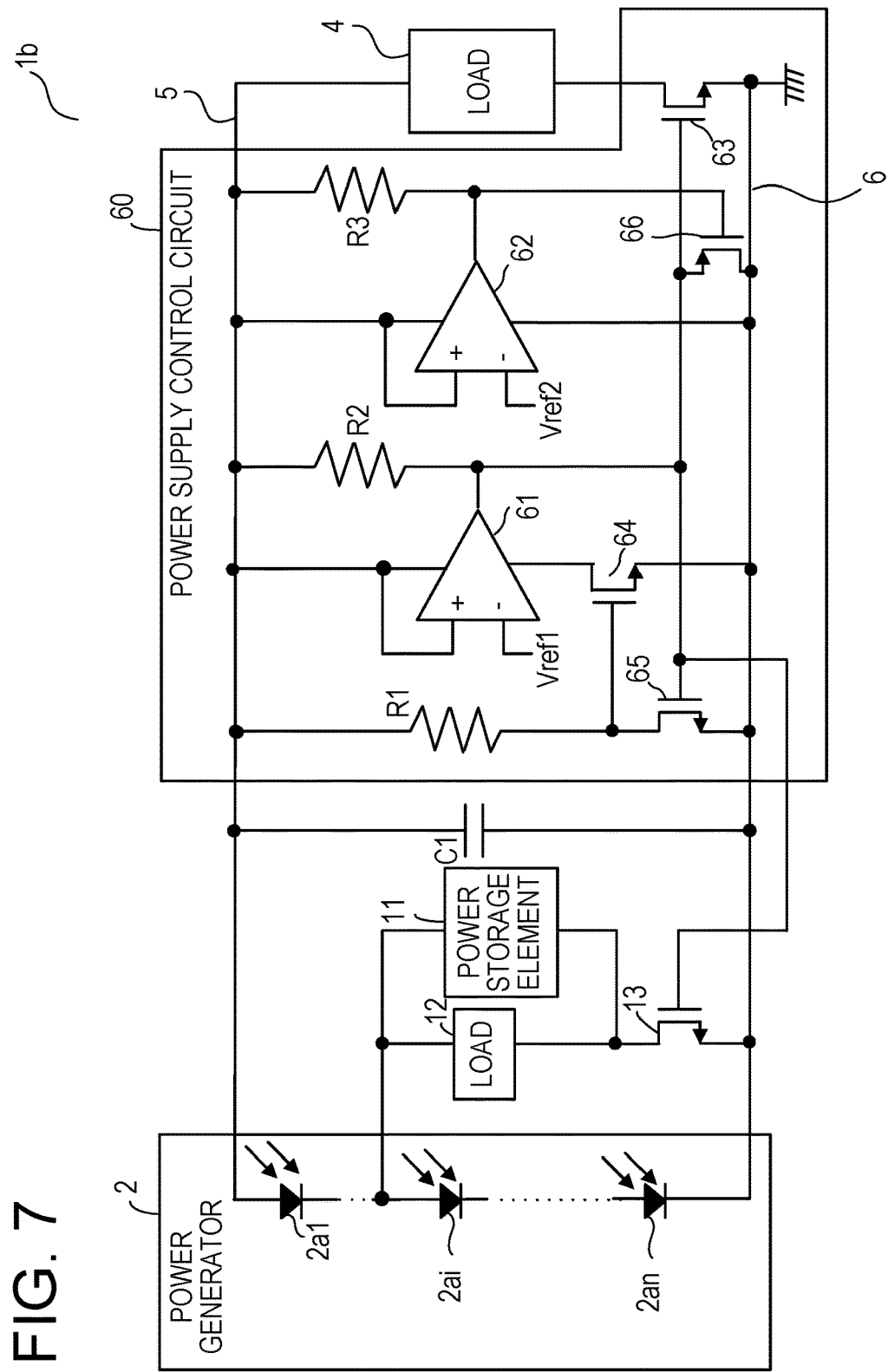
FIG. 7 is a diagram illustrating an example of an electronic device including a power supply control circuit.

FIG. 7 is a diagram illustrating an example of an electronic device including a power supply control circuit. The same elements as those illustrated in FIG. 1 are denoted by the same reference numerals.

An electronic device 1b includes a power supply control circuit 60. The power supply control circuit 60 includes comparators 61 and 62, transistors 63, 64, 65, and 66, and resistors R1, R2, and R3. In the example of FIG. 7, the transistors 63 to 65 are n-channel MOSFETs and the transistor 66 is a p-channel MOSFET.

The comparator 61 and the transistor 64 are connected between the high potential power line 5 and the low potential power line 6. The comparator 61 compares the DC voltage Vin to be supplied to the load 4 from the power generator 2 to the reference voltage Vref and outputs the comparison result, similarly to the comparator 10 illustrated in FIG. 1.

The output terminal of the comparator 61 is connected to the high potential power line 5 through the resistor R2 and gates of the transistors 63 and 65, and a source of the transistor 66. Furthermore, the output terminal of the comparator 61 is connected to the gate of the switch 13 (n-channel MOSFET) described above.

The comparator 62 is connected between the high potential power line 5 and the low potential power line 6, and compares the DC voltage Vin supplied to the load 4 from the power generator 2 to the reference voltage Vref and outputs the comparison result, similarly to the comparator 61. An output terminal of the comparator 62 is connected to the high potential power line 5 through the resistor R3 and is connected to the gate of the transistor 66.

The drain of the transistor 63 is connected to the load 4 and the source of the transistor 63 is connected to the low potential power line 6. The drain of the transistor 64 is connected to the comparator 61 and the source of the transistor 64 is connected to the low potential power line 6. The gate of the transistor 64 is connected to the high potential power line 5 through the resistor R1 and also connected to the drain of the transistor 65. The source of the transistor 65 is connected to the low potential power line 6. The drain of the transistor 66 is connected to the low potential power line 6.

In the power supply control circuit 60 described above, when the DC voltage Vin is greater than the reference voltage Vref, the switch 13 is turned ON by the comparison result output by the comparator 61 and the overvoltage protection operation as described above is performed. The current generated by the power generation elements 2ai to 2an is supplied to the power storage element 11 and the load 12 such that the generated power is prevented from becoming useless.

When the power supply control circuit 60 is utilized, the output terminal of the comparator 61 is connected to the gate of the switch 13 such that the comparator 10 illustrated in FIG. 1 may not be provided.

In the meantime, when a secondary battery is provided apart from the power storage element 11 illustrated in FIG. 1 and FIG. 6, the output signal of the comparator 62 included in the power supply control circuit 60 may be used for the control of the switch for preventing over-discharge of the secondary battery.

Figure 8:
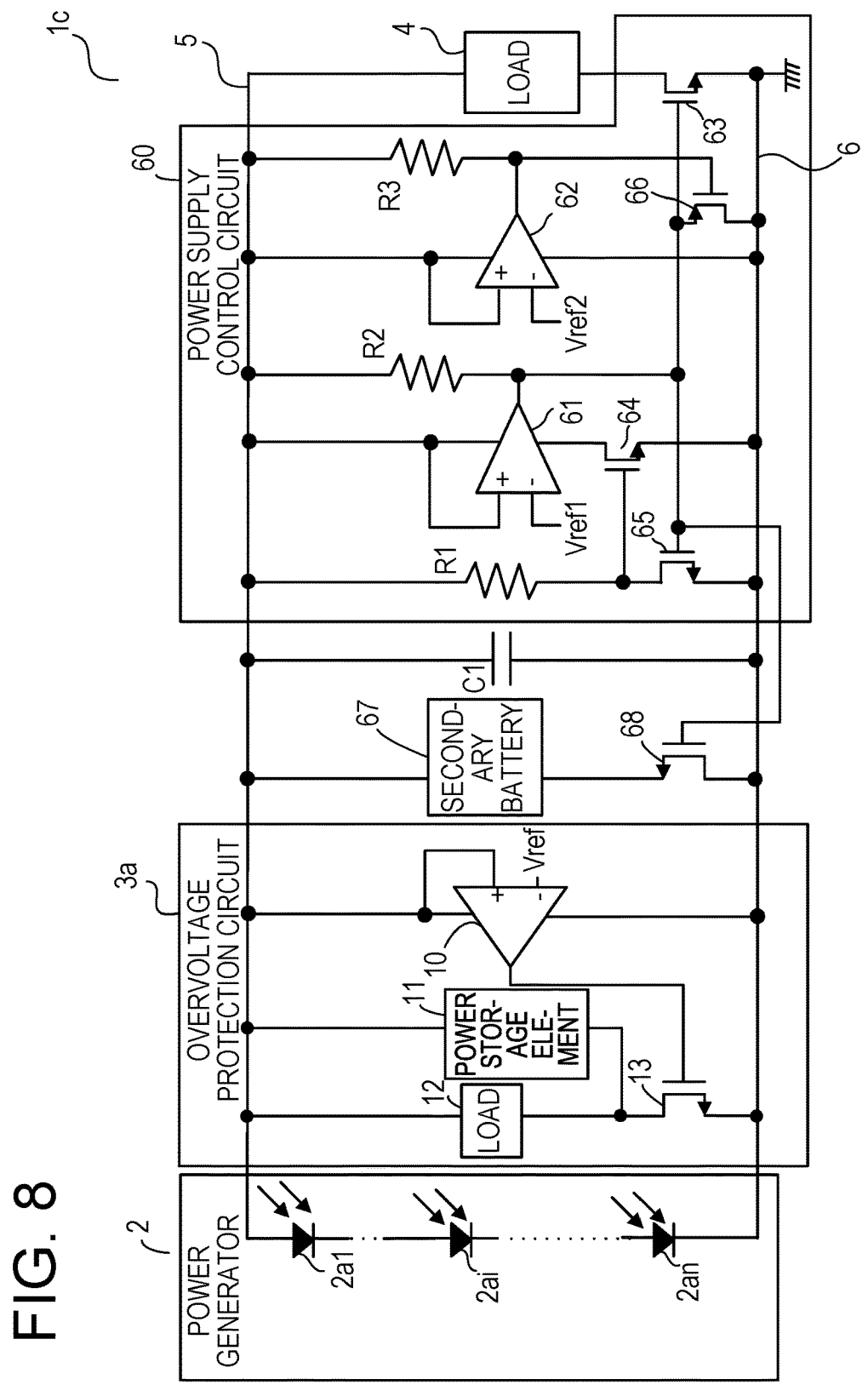
FIG. 8 is a diagram illustrating an example of an electronic device including a power supply control circuit and a secondary battery.

FIG. 8 is a diagram illustrating an example of an electronic device including a power supply control circuit and a secondary battery. The same elements as those illustrated in FIG. 6 and FIG. 7 are denoted by the same reference numerals. An electronic device 1c of FIG. 8 includes a secondary battery 67 and a switch 68 connected in series between the high potential power line 5 and the low potential power line 6.

The secondary battery 67 accumulates power generated by the power generator 2. The switch 68 is, for example, an n-channel MOSFET illustrated in FIG. 8 of which the source is connected to the secondary battery 67 and the drain is connected to the low potential power line 6. The gate of the switch 68 is connected to the source of the transistor 66.

In the electronic device 1c, threshold voltages to be compared with the DC voltage Vin by the comparators 61 and 62 are assumed as Vref1 and Vref2, respectively. The relationship between the Vref1 and Vref2 and the reference voltage Vref to be compared with the DC voltage Vin by the comparator 10 is assumed as Vref>Vref1>Vref2.

When the DC voltage Vin is increased to be higher than the reference voltage Vref, the switch 13 is turned ON as described above and a portion of the currents to be supplied to the load 4 flows in the power storage element 11 and the load 12 and thus, overvoltage is prevented from being applied to the load 4. When the DC voltage Vin is decreased to be lower than the reference voltage Vref2, the transistor 66 is turned ON. Accordingly, the switch 68 is turned OFF and over-discharge of the secondary battery 67 is suppressed.

Second Embodiment

Figure 9:
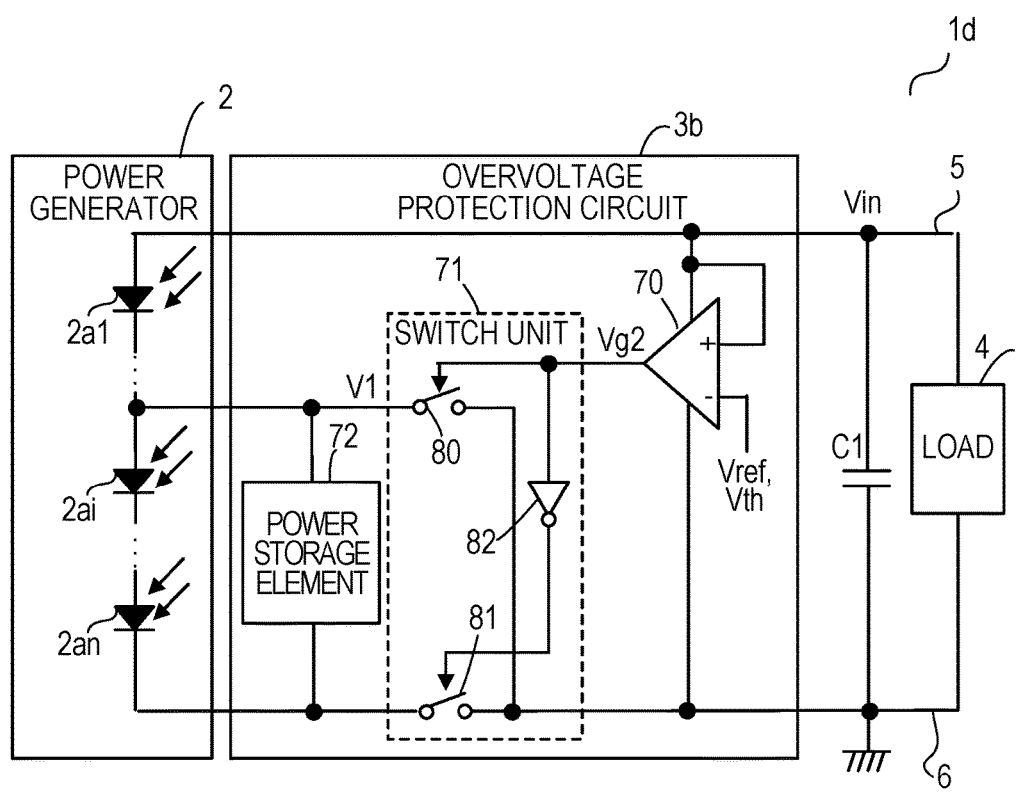
FIG. 9 is a diagram illustrating an example of an overvoltage protection circuit according to a second embodiment.

FIG. 9 is a diagram illustrating an example of an overvoltage protection circuit according to a second embodiment. The same elements as those illustrated in FIG. 1 are denoted by the same reference numerals.

An overvoltage protection circuit 3b according to the second embodiment included in an electronic device 1d illustrated in FIG. 9 includes a comparator 70, a switch unit 71, and a power storage element 72.

The comparator 70 is, for example, a hysteresis type comparator. The comparator 70 is connected between the high potential power line 5 and the low potential power line 6, compares the DC voltage Vin supplied from the power generator 2 to the load 4 with a threshold voltage Vth smaller than the reference voltage Vref and the reference voltage Vref, and outputs the comparison result. The comparator 70 is operated by the DC voltage Vin supplied from the power generator 2. The reference voltage Vref is set based on the upper limit of the operating voltage of the load 4. The threshold voltage Vth is set based on the lower limit of the operating voltage of the load 4. The threshold voltage Vth may be the lower limit of the operating voltage of the load 4 and may be a value which is higher than the lower limit by a specified voltage.

The comparator 70 outputs a signal having a logic level of H level, for example, when the DC voltage Vin exceeds the reference voltage Vref and outputs a signal having a logic level of L level when the DC voltage Vin is lower than the threshold voltage Vth.

The reference voltage Vref or the threshold voltage Vth is obtained by dividing the DC voltage Vin by, for example, a resistance voltage-dividing circuit which is not illustrated. The supply of power to the comparator 70 or the generation of the reference voltage Vref and the threshold voltage Vth may also be performed using a primary battery.

When a comparison result indicating that the DC voltage Vin is higher than the reference voltage Vref is received as a comparison result output from the comparator 70, the switch unit 71 interrupts the supply of power to the load 4 from some of power generation elements 2ai to 2an among the power generation elements 2a1 to 2an. When a comparison result indicating that the DC voltage Vin is lower than the threshold voltage Vth is received as a comparison result output from the comparator 70, the switch unit 71 switches a flow of the current such that the power is supplied from the power generation elements 2a1 to 2an and the power storage element 72 to the load 4.

The switch unit 71 includes switches 80 and 81 and an inverter circuit 82 which inverts the logic level of an output signal of the comparator 70.

The switch 80 is connected between one end of the power generation element 2ai and the low potential power line 6.

The switch 81 is connected between one end of the power generation element 2an and the low potential power line 6. The switches 80 and 81 are, for example, n-channel MOSFETs.

When the switch unit 71 receives a comparison result indicating that the DC voltage Vin is higher than the reference voltage Vref from the comparator 70, the switch 80 is turned ON and the switch 81 is turned OFF.

The power storage element 72 accumulates electrical charges caused by the current supplied from the power generation elements 2ai to 2an described above. One end of the power storage element 72 is connected to one end of the power generation element 2a1 and the other end of the power storage element 72 is connected to one end of the power generation element 2an. That is, the power storage element 72 is connected to the series circuit formed with the power generation elements 2ai to 2an in parallel. The power storage element 72 is, for example, a capacitor or a secondary battery.

In the following, descriptions will be made on an example of an overvoltage protection control method by the overvoltage protection circuit 3b according to the second embodiment.

Figure 10:
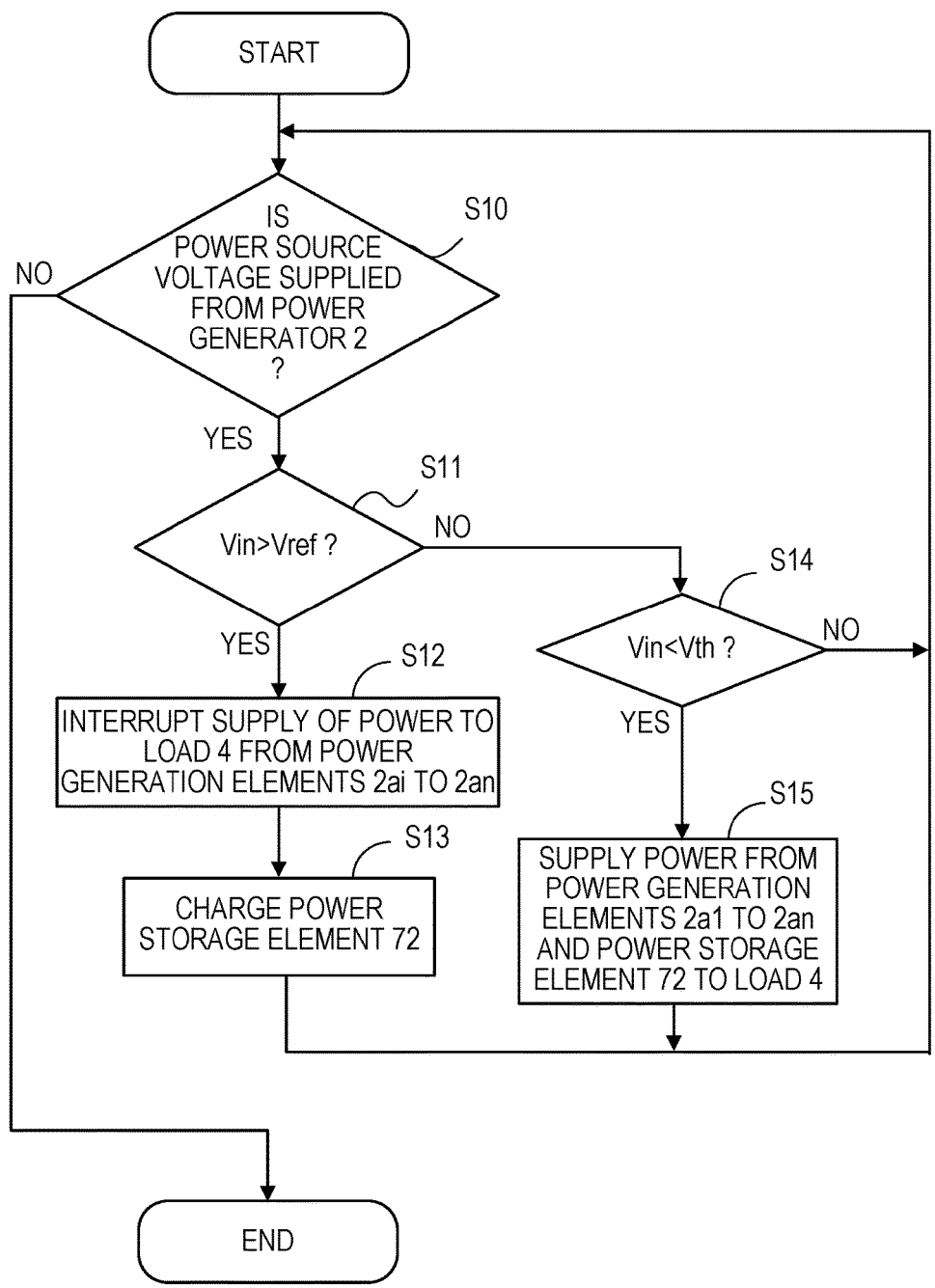
FIG. 10 is a flowchart illustrating an example of an overvoltage protection control method according to the second embodiment.

FIG. 10 is a flowchart illustrating an example of an overvoltage protection control method according to the second embodiment. When the power source voltage (DC voltage Vin) is supplied from the power generator 2 ("YES" at Operation S10), the comparator 70 determines whether the DC voltage Vin output by the power generator 2 is higher than the reference voltage Vref (Operation S11). When it is determined that the DC voltage Vin is higher than the reference voltage Vref ("YES" at Operation S11), the comparator 70 outputs a comparison result indicating that the DC voltage Vin is higher than the reference voltage Vref.

When the comparison result indicating that the DC voltage Vin is higher than the reference voltage Vref is received ("YES" at Operation S11), the switch unit 71 turns the switch 80 ON and turns the switch 81 OFF to interrupt the supply of power to the load 4 from the power generation elements 2ai to 2an (Operation S12).

The power storage element 72 is charged with the current supplied from the power generation elements 2ai to 2an (Operation S13). Thereafter, when supply of the power source voltage from the power generator 2 continues ("YES" at Operation S10), processing from Operation S11 is repeated.

In the meantime, when the DC voltage Vin is less than or equal to the reference voltage Vref ("NO" at Operation S11), the comparator 70 determines whether the DC voltage Vin is lower than the threshold voltage Vth (Operation S14). When it is determined that the DC voltage Vin is lower than the threshold voltage Vth ("YES" at Operation S14), the comparator 70 outputs a comparison result indicating that the DC voltage Vin is lower than the threshold voltage Vth.

When the comparison result indicating that the DC voltage Vin is lower than the threshold voltage Vth is received ("YES" at Operation S14), the switch unit 71 turns the switch 80 OFF and turns the switch 81 ON. Accordingly, the supply of power from the power generation elements 2a1 to 2an and the power storage element 72 to the load 4 is performed (Operation S15).

In a state where the DC voltage Vin is greater than or equal to the threshold voltage Vth ("NO" at Operation S14) and after Operation S15, when supply of the power source voltage from the power generator 2 continues ("YES" at Operation S10), processing from Operation S11 is repeated.

When the power source voltage is not supplied from the power generator 2, the comparator 70 does not operate and the operation of the overvoltage protection circuit 3b is ended.

Figure 11:
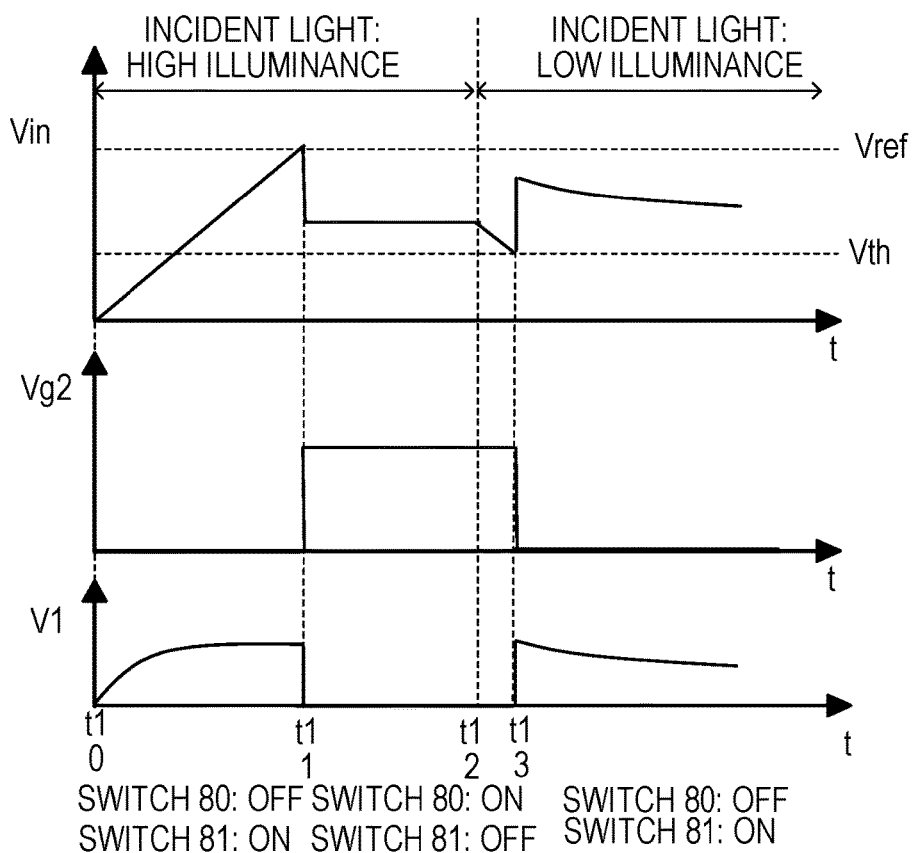
FIG. 11 is a timing chart illustrating an example of operations of the overvoltage protection circuit according to the second embodiment.

FIG. 11 is a timing chart illustrating an example of operations of the overvoltage protection circuit according to the second embodiment. In FIG. 11, examples of temporal change in the DC voltage Vin, output signal Vg2 (which corresponds to a comparison result) of the comparator 70, and voltage V1 across both ends of the switch 80 are illustrated.

When the power generator 2 is irradiated with incident light having high illuminance (e.g., 5000 Lux), the DC voltage Vin is gradually raised from timing t10. Until the DC voltage Vin is higher than the reference voltage Vref, the switch 80 is in a state of being turned OFF and the switch 81 is in a state of being turned ON, and the voltage V1 across both ends of the switch 80 is raised up to a specified voltage.

When the DC voltage Vin is higher than the reference voltage Vref (timing t11), the logic level of an output signal Vg2 of the comparator 70 becomes H level, the switch 80 is turned ON, and the switch 81 is turned OFF. In this case, the supply of power to the load 4 by the power generation elements 2ai to 2an is interrupted.

For that reason, the DC voltage Vin is lowered such that the voltage to be applied to the load 4 may be suppressed. That is, the load 4 may be protected from overvoltage. The switch is 80 turned ON and accordingly, the voltage V1 falls. In this case, the power storage element 72 is charged with the current supplied from the power generation elements 2ai to 2an.

When the power generator 2 is irradiated with incident light having low illuminance (e.g., 500 Lux), the DC voltage Vin is further lowered from timing t12 from timing t12. When the DC voltage Vin is lower than the threshold voltage Vth (timing t13), the logic level of the output signal Vg2 of the comparator 70 becomes L level, the switch 80 is turned OFF, and the switch 81 is turned ON.

With this, the supply of power from all of the power generation elements 2a1 to 2an and the power storage element 72 to the load 4 is performed, and the DC voltage Vin is raised. The switch 80 is turned OFF and accordingly, the voltage V1 is raised.

As described above, when the supply of power from the power generation elements 2ai to 2an to the load 4 is interrupted, the power storage element 72 is charged with the current supplied from the power generation elements 2ai to 2an. The electrical charges charged in the power storage element 72 are used for the supply of power to the load 4 after timing t13 and thus, it becomes possible to operate the load 4 even in a case of low illuminance.

As such, it is also possible to suppress the power generated by the power generation elements 2ai to 2an from becoming useless in the overvoltage protection circuit 3b of the second embodiment. That is, it is possible to suppress a power loss.

A load connected to the power storage element 72 in parallel may also be provided in the overvoltage protection circuit 3b of the second embodiment.

Figure 12:
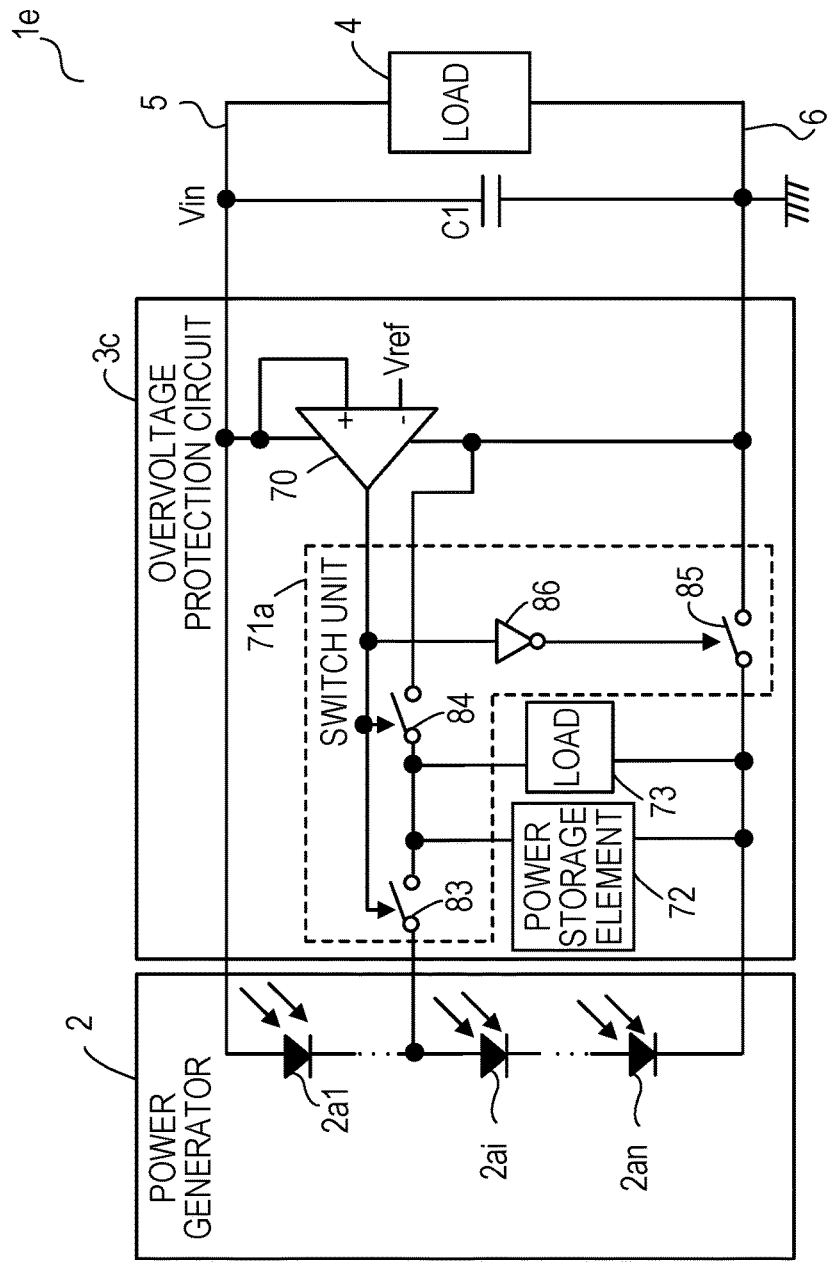
FIG. 12 is a diagram illustrating another example of the overvoltage protection circuit, to which a load is added, according to the second embodiment.

FIG. 12 is a diagram illustrating another example of the overvoltage protection circuit, to which a load is added, according to the second embodiment. The same elements as those illustrated in FIG. 9 are denoted by the same reference numerals.

An overvoltage protection circuit 3c of an electronic device 1e illustrated in FIG. 12 includes a load 73 connected to the power storage element 72 in parallel. As for the load 73, various electronic circuits or electronic devices may be applied other than various sensors such as, for example, a temperature sensor or a humidity sensor. The load 73 may be provided outside of the overvoltage protection circuit 3c.

A circuit configuration of the switch unit 71a is different from that of the switch unit 71 illustrated in FIG. 9. When a comparison result indicating that the DC voltage Vin is higher than the reference voltage Vref is received as a comparison result output from the comparator 70, the switch unit 71a interrupts the supply of power to the load 4 from some of power generation elements 2ai to 2an among the power generation elements 2a1 to 2an. When a comparison result indicating that the DC voltage Vin is lower than the threshold voltage Vth is received from the comparator 70, the switch unit 71a switches a flow of the current such that the power is supplied from the power generation elements 2a1 to 2an to the load 4 and supplied from the power storage element 72 to the load 73.

The switch unit 71a includes switches 83, 84, and 85 and an inverter circuit 86 which inverts the logic level of an output signal of the comparator 70.

One end of the switch 83 is connected to one end of the power generation element 2ai and the other end of the switch 83 is connected to one ends of the power storage element 72, the load 73, and the switch 84. The other end of the switch 84 is connected to the low potential power line 6. One end of the switch 85 is connected to one end of the power generation element 2an, the other end of the power storage element 72, and the other end of the load 73. The other end of the switch 85 is connected to the low potential power line 6. The switches 83 to 85 are, for example, n-channel MOSFETs.

When the switch unit 71a receives a comparison result indicating that the DC voltage Vin is higher than the reference voltage Vref from the comparator 70, the switches 83 and 84 are turned ON and the switch 85 is turned OFF. Thus, the supply of power from the power generation elements 2ai to 2an to the load 4 is interrupted. For that reason, the DC voltage Vin is lowered such that the voltage to be applied to the load 4 may be suppressed. That is, it is possible to protect the load 4 from an overvoltage.

The power storage element 72 is charged with the current supplied from the power generation elements 2ai to 2an. The power storage element 72 is charged and thus, when the voltage applied to the load 73 reaches a specified operating voltage, the load 73 performs a predetermined operation (e.g., sensor operation).

In the meantime, when the switch unit 71a receives a comparison result indicating that the DC voltage Vin is lower than the threshold voltage Vth from the comparator 70, the switches 83 and 84 are turned OFF and the switch 85 is turned ON. With this, the supply of power from all of the power generation elements 2a1 to 2an to the load 4 is performed and the DC voltage Vin is increased. The load 73 may continue to operate by the supply of power from the power storage element 72.

In the meantime, the power supply control circuit 60 illustrated in FIG. 7 may be utilized also in the electronic device 1d illustrated in FIG. 9 in order to supply stabilized power to the load 4. A comparator included in the power supply control circuit may be utilized instead of the comparator 70 of the overvoltage protection circuit 3b illustrated in, for example, FIG. 9.

Figure 13:
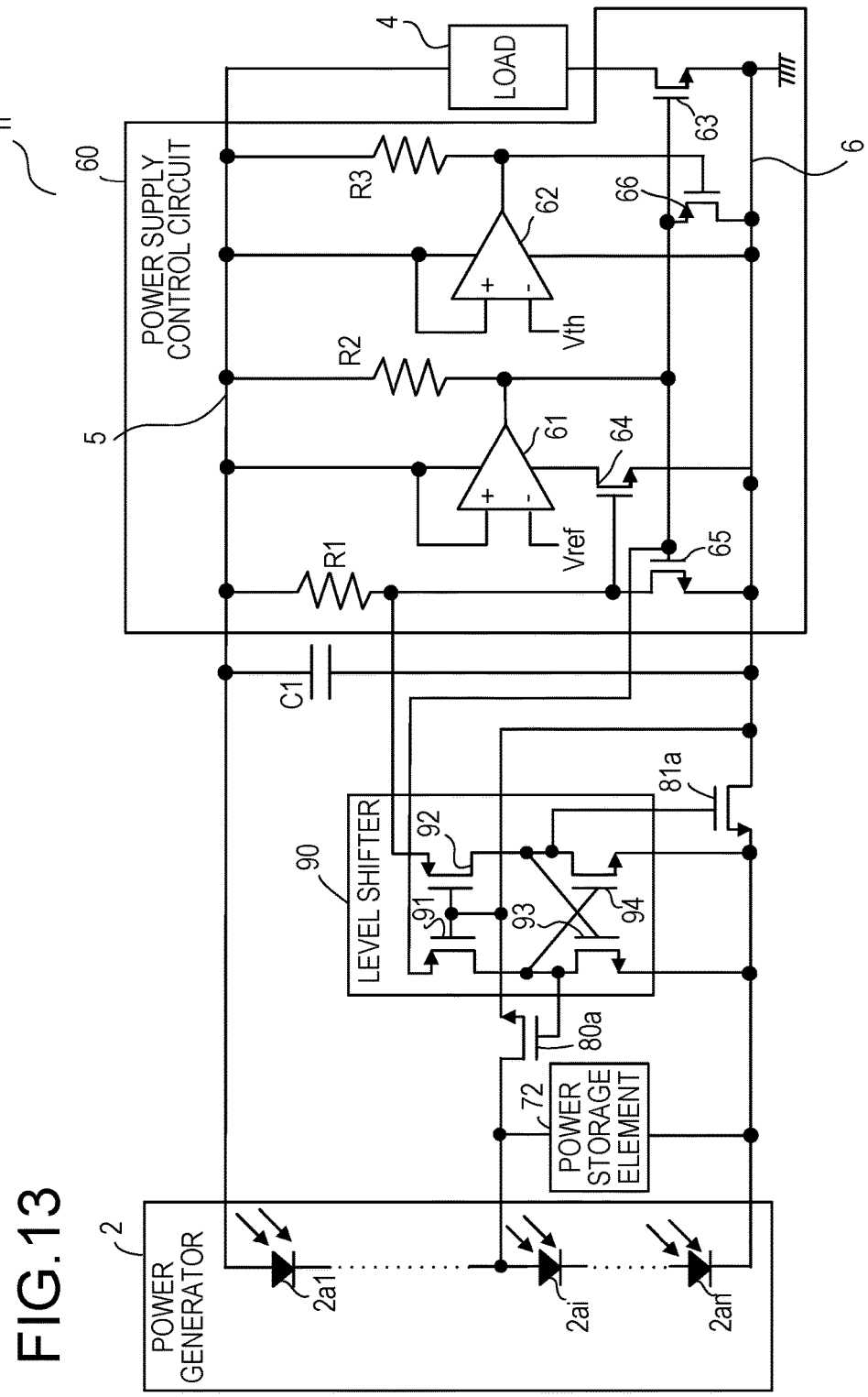
FIG. 13 is a diagram illustrating an example of an electronic device including another power supply control circuit.

FIG. 13 is a diagram illustrating an example of an electronic device including another power supply control circuit. The same elements as those illustrated in FIG. 7 and FIG. 9 are denoted by the same reference numerals.

In an electronic device 1f of FIG. 13, the transistors 80a and 81a correspond to the switches 80 and 81 illustrated in FIG. 9. The transistors 80a and 81a are the n-channel MOSFETs.

The transistors 80a and 81a are turned ON or OFF based on the output signals of the comparators 61 and 62 of the power supply control circuit 60. The level shifter 90 is provided to completely turn the transistor 81a OFF when the DC voltage Vin is higher than the reference voltage Vref.

A level shifter 90 includes transistors 91, 92, 93, and 94. The transistors 91 and 92 are p-channel MOSFETs and the transistors 93 and 94 are n-channel MOSFETs.

The source of the transistor 91 is connected to the output terminal of the comparator 61, the gates of the transistors 63 and 65, and the source of the transistor 66. The drain of the transistor 91 is connected to the gate of the transistor 94, the drain of the transistor 93, and the gate of the transistor 80a. The gates of the transistors 91 and 92 are connected to the low potential power line 6.

The source of the transistor 92 is connected to the resistor R1 of the power supply control circuit 60, the drain of the transistor 65, and the gate of the transistor 64. The drain of the transistor 92 is connected to the gate of the transistor 93, the drain of the transistor 94, and the gate of the transistor 81a.

The drain of the transistor 93 is connected to the drain of the transistor 91 and the gates of the transistors 80a and 94. The source of the transistor 93 is connected to one end of the power generation element 2an. The gate of the transistor 93 is connected to the drains of the transistors 92 and 94 and the gate of the transistor 81a.

The drain of the transistor 94 is connected to the drain of the transistor 92 and the gates of the transistors 81a and 93. The source of the transistor 94 is connected to one end of the power generation element 2an. The gate of the transistor 94 is connected to the drains of the transistors 91 and 93 and the gate of the transistor 80a.

In the electronic device 1f described above, it is assumed that a comparison result between the DC voltage Vin and the reference voltage Vref is output from the comparator 61, and a comparison result between the DC voltage Vin and the threshold voltage Vth described above is output from the comparator 62.

When the DC voltage Vin is higher than the reference voltage Vref, the comparator 61 outputs an output signal having the logic level of H level as a comparison result. The gate of the transistor 91 is connected to the low potential power line 6 which is the ground potential and thus, the transistor 91 is turned ON and the transistors 80a and 94 are also turned ON. In the meantime, when the comparator 61 outputs an output signal having the logic level of H level, the transistor 65 of the power supply control circuit 60 is turned ON and thus, the gate potential and source potential of the transistor 92 become substantially equal and the transistor 92 is turned OFF. The transistor 91 is turned ON and accordingly, the transistor 94 is also turned ON. Accordingly, the gate potential of the transistor 81a becomes substantially the ground potential and the transistor 81a is turned OFF. Accordingly, the supply of power from the power generation elements 2ai to 2an to the load 4 is interrupted.

When the DC voltage Vin is lower than the threshold voltage Vth, the comparator 62 outputs an output signal having the logic level of L level as a comparison result. Accordingly, the transistor 66 is turned ON and the gate potential of the transistor 65 becomes substantially the ground potential and thus, the transistor 65 is turned OFF.

When the transistor 65 is turned OFF, the transistor 92 of the level shifter 90 is turned ON. In contrast, the gate potential and the source potential of the transistor 91 become substantially equal and the transistor 91 is turned OFF. The transistor 91 is turned OFF and the transistor 92 is turned ON such that the transistor 93 is turned ON and the transistor 80a is turned OFF. The transistor 94 is turned OFF and the transistor 81a is turned ON. With this, the supply of power from all of the power generation elements 2a1 to 2an to the load 4 is performed.

The power supply control circuit 60 described above may be applied to the electronic device 1e illustrated in FIG. 12, such that the comparators 61 and 62 of the power supply control circuit 60 instead of the comparator 70 may be employed.

Thus, although descriptions have been made on aspects of the overvoltage protection circuit and the overvoltage protection control method according to the present disclosure based on the embodiments, these aspects are just an example and are not limited to the matters described above. For example, the switch 13 of FIG. 1 is configured as an n-channel MOSFET, but may also be configured as a p-channel MOSFET. In this case, an inverter circuit which inverts the logic level of the output signal of the comparator 10 may be added, or a connection site may be changed to a position located between the power storage element 11 combined with the load 12 and one end of the power generation element 2ai, and otherwise, may be suitably changed. The matters described above may also be similarly applied to other circuits described above.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to an illustrating of the superiority and inferiority of the invention. Although the embodiments of the present invention have been described in detail, it should be understood that the various changes, substitutions, and alterations could be made hereto without departing from the spirit and scope of the invention.

What is claimed is:

1. An overvoltage protection circuit comprising: a comparator configured to compare a DC voltage supplied to a first load by a power generator with a first value set based on an upper limit of an operating voltage of the first load;
   a storage element configured to be charged with a portion of a current generated by the power generator; and
   a switch configured to change a flow of the current generated by the power generator so that:
   when the DC voltage is higher than the first value, the portion of the current is supplied to the storage element and a second load coupled to the storage element in parallel, and
   when the DC voltage is less than or equal to the first value, the storage element supplies the second load with power,
   wherein the switch is configured to change the flow of the current so that another portion of the current generated by the power generator is supplied to the first load when the DC voltage is higher than the first value.

2. The overvoltage protection circuit according to claim 1, further comprising: a power supply control circuit configured to stabilize power supplied to the first load, wherein the power supply control circuit includes the comparator.

3. An overvoltage protection circuit comprising:
a comparator configured to compare a DC voltage supplied to a first load by a plurality of power generators connected in series with a first value set based on an upper limit of an operating voltage of the first load and a second value set based on a lower limit of the operating voltage of the first load, wherein the first value is larger than the second value;
a storage element configured to be charged with a current generated by one or more power generators of the plurality of power generators; and
a switch configured to change a flow of the current so that:
when the DC voltage is higher than the first value, a current to the first load is interrupted, by the switch,
when the DC voltage is lower than the second value, the plurality of power generators supplies the first load with power and the storage element supplies the first load with power, by the switch, and
when the DC voltage is lower than or equal to the first value and higher than or equal to the second value, the current is supplied to the first load, by the switch,
wherein the switch is configured to change the flow of the current so that a portion of the current generated by the plurality of power generators is supplied to the storage element when the DC voltage is higher than the first value.

4. The overvoltage protection circuit according to claim 3, further comprising:
a second load coupled to the storage element in parallel,
wherein, when the DC voltage is lower than the second value, the plurality of power generators supplies the first load with power and the storage element supplies the second load with power, by the switch.

5. The overvoltage protection circuit according to claim 3, further comprising:
a power supply control circuit configured to stabilize power supplied to the first load,
wherein the power control circuit includes the comparator.

6. An overvoltage protection control method comprising:
comparing a DC voltage supplied to a first load by a first power generator with a first value set based on an upper limit of an operating voltage of the first load;
changing a flow of a current generated by the power generator so that:
when the DC voltage is higher than the first value, a portion of the current is supplied to a storage element and a second load coupled to the storage element in parallel, and another portion of the current generated by the power generator is supplied to the first load, and
when the DC voltage is less than or equal to the first value, the storage element supplies the second load with power.

7. The overvoltage protection control method according to claim 6,
wherein the first power generator includes a plurality of second power generators, and
wherein, when the DC voltage is higher than the first value, a current to the first load is interrupted and a current generated by one or more second power generators of the plurality of second power generators is charged in the storage element.

* * * * *